(12) United States Patent
Wolford et al.

(10) Patent No.: US 11,733,762 B2
(45) Date of Patent: Aug. 22, 2023

(54) METHOD TO ALLOW FOR HIGHER USABLE POWER CAPACITY IN A REDUNDANT POWER CONFIGURATION

(71) Applicant: Lenovo Global Technology (United States) Inc., Morrisville, NC (US)

(72) Inventors: Robert R Wolford, Strongsville, OH (US); Paul T. Artman, Cary, NC (US)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 0 days.

(21) Appl. No.: 17/580,417

(22) Filed: Jan. 20, 2022

(65) Prior Publication Data

US 2023/0229223 A1    Jul. 20, 2023

(51) Int. Cl.
*G06F 1/324*        (2019.01)
*G06F 1/30*         (2006.01)
*H05K 7/20*         (2006.01)

(52) U.S. Cl.
CPC ............ *G06F 1/324* (2013.01); *G06F 1/30* (2013.01); *H05K 7/20218* (2013.01)

(58) Field of Classification Search
CPC ........ G06F 1/324; G06F 1/30; H05K 7/20218
See application file for complete search history.

(56) References Cited

U.S. PATENT DOCUMENTS

| | | | | |
|---|---|---|---|---|
| 9,595,742 | B2* | 3/2017 | Brookshire | H01M 10/48 |
| 9,832,088 | B2* | 11/2017 | Myrah | G06F 1/3206 |
| 9,910,472 | B1* | 3/2018 | Wishman | H02J 9/061 |
| 10,409,352 | B2* | 9/2019 | Chadha | G06F 1/263 |
| 11,036,271 | B2* | 6/2021 | Eastman | G06F 1/189 |
| 11,226,665 | B2* | 1/2022 | Messick | G06F 11/2015 |
| 2003/0222618 | A1* | 12/2003 | Kanouda | H02J 9/062 |
| | | | | 320/116 |
| 2009/0260777 | A1* | 10/2009 | Attlesey | H01L 23/473 |
| | | | | 165/104.33 |
| 2009/0307512 | A1* | 12/2009 | Munjal | G06F 1/30 |
| | | | | 713/324 |
| 2015/0370301 | A1* | 12/2015 | Bolan | G06F 1/263 |
| | | | | 713/322 |
| 2016/0070327 | A1* | 3/2016 | Nemani | G06F 1/3206 |
| | | | | 713/300 |
| 2017/0117940 | A1* | 4/2017 | Cafe | H04B 3/544 |

* cited by examiner

*Primary Examiner* — Aurel Prifti
(74) *Attorney, Agent, or Firm* — Kunzler Bean & Adamson; Bruce R. Needham

(57) ABSTRACT

A method includes receiving a power supply unit ("PSU") replacement signal for a power supply chassis that includes plurality of supply enclosures. Each power supply enclosure includes a plurality of power supply units ("PSUs"). Each of the PSUs in the power supply enclosures is connected to a power bus powering computing equipment. PSU redundancy policy has at least one PSU being redundant. In response to the PSU replacement signal, the method calculates a power cap limit equal to a capacity of the plurality of supply enclosures that are not being removed. Power consumption of the computing equipment is limited to the power cap limit. In response to detecting a replacement power supply enclosure, the method recalculates the power cap limit based on all of the PSUs according to the PSU redundancy policy. Power consumption of the computing equipment is limited to the recalculated power cap limit.

20 Claims, 6 Drawing Sheets

METHOD TO ALLOW FOR HIGHER USABLE POWER CAPACITY IN A REDUNDANT POWER CONFIGURATION

FIELD

The subject matter disclosed herein relates to power supply redundancy and more particularly relates to allowing for higher usable power capacity for a redundant power configuration.

BACKGROUND

Computing equipment in some systems, such as datacenter computing equipment, is fed from a power bus and the power bus is fed by multiple power supplies. To increase reliability, a redundancy policy is often implemented where one or more of the power supplies is considered to be redundant. Where a redundancy policy is in place, a total number of the power supplies is reduced so that if a power supply fails, the same total power capacity is available.

Some power supplies are ganged together in a power supply enclosure. For example, the power supply enclosure may be water cooled so to reduce water connections the power supply enclosure is connected to a single in/out water connection pair. However, when a power supply in a power supply enclosure fails, typically the entire power supply enclosure is deemed failed and the total power capacity is reduced by the capacity of the power supply enclosure even if some the power supplies in the power supply enclosure are still functional.

BRIEF SUMMARY

A method for allowing for higher usable power capacity for a redundant power configuration is disclosed. An apparatus and computer program product also perform the functions of the method. The method includes receiving a power supply unit ("PSU") replacement signal for a power supply chassis. The power supply chassis includes plurality of supply enclosures and each power supply enclosure includes a plurality of power supply units ("PSUs"). Each of the PSUs in the plurality of supply enclosures is connected to a power bus providing power to computing equipment connected to the power bus. The power supply chassis has a PSU redundancy policy with at least one PSU of the PSUs of the plurality of supply enclosures being redundant and the PSU replacement signal indicates that a user is about to replace a power supply enclosure. In response to the PSU replacement signal, the method includes calculating a power cap limit that is equal to or less than a capacity of the plurality of supply enclosures that are not being removed. Power consumption of the computing equipment is limited to the power cap limit. In response to detecting a replacement power supply enclosure, the method includes recalculating the power cap limit based on the PSUs of the plurality of supply enclosures including the replacement power supply enclosure. The power cap limit is in compliance with the PSU redundancy policy. Power consumption of the computing equipment is limited to the recalculated power cap limit.

An apparatus for allowing for higher usable power capacity for a redundant power configuration includes a replacement signal detector configured to receive a PSU replacement signal for a power supply chassis. The power supply chassis includes plurality of supply enclosures and each power supply enclosure includes a plurality of PSUs. Each of the PSUs in the plurality of supply enclosures is connected to a power bus providing power to computing equipment connected to the power bus. The power supply chassis has a PSU redundancy policy with at least one PSU of the PSUs of the plurality of supply enclosures being redundant. The PSU replacement signal indicates that a user is about to replace a power supply enclosure. The apparatus includes a power cap calculator configured to, in response to the PSU replacement signal, the program code is executable by the processor to calculate a power cap limit that is equal to or less than a capacity of the plurality of supply enclosures that are not being removed. Power consumption of the computing equipment is limited to the power cap limit. The apparatus includes an enclosure detector configured to, in response to detecting a replacement power supply enclosure, the program code is executable by the processor to recalculate the power cap limit based on the PSUs of the plurality of supply enclosures including the replacement power supply enclosure. The power cap limit is in compliance with the PSU redundancy policy and power consumption of the computing equipment is limited to the recalculated power cap limit.

A program product for allowing for higher usable power capacity for a redundant power configuration includes non-volatile storage with program code. The program code is configured to be executable by a processor to perform operations comprising receiving a PSU replacement signal for a power supply chassis. The power supply chassis includes plurality of supply enclosures and each power supply enclosure includes a PSUs. Each of the PSUs in the plurality of supply enclosures is connected to a power bus providing power to computing equipment connected to the power bus. The power supply chassis includes a PSU redundancy policy with at least one PSU of the PSUs of the plurality of supply enclosures being redundant and the PSU replacement signal indicates that a user is about to replace a power supply enclosure. The program code is further configured to, in response to the PSU replacement signal, perform operations comprising calculating a power cap limit that is equal to or less than a capacity of the plurality of supply enclosures that are not being removed. Power consumption of the computing equipment is limited to the power cap limit. The program code is further configured to, in response to detecting a replacement power supply enclosure, perform operations comprising recalculating the power cap limit based on the PSUs of the plurality of supply enclosures including the replacement power supply enclosure. The power cap limit is in compliance with the PSU redundancy policy and power consumption of the computing equipment is limited to the recalculated power cap limit.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
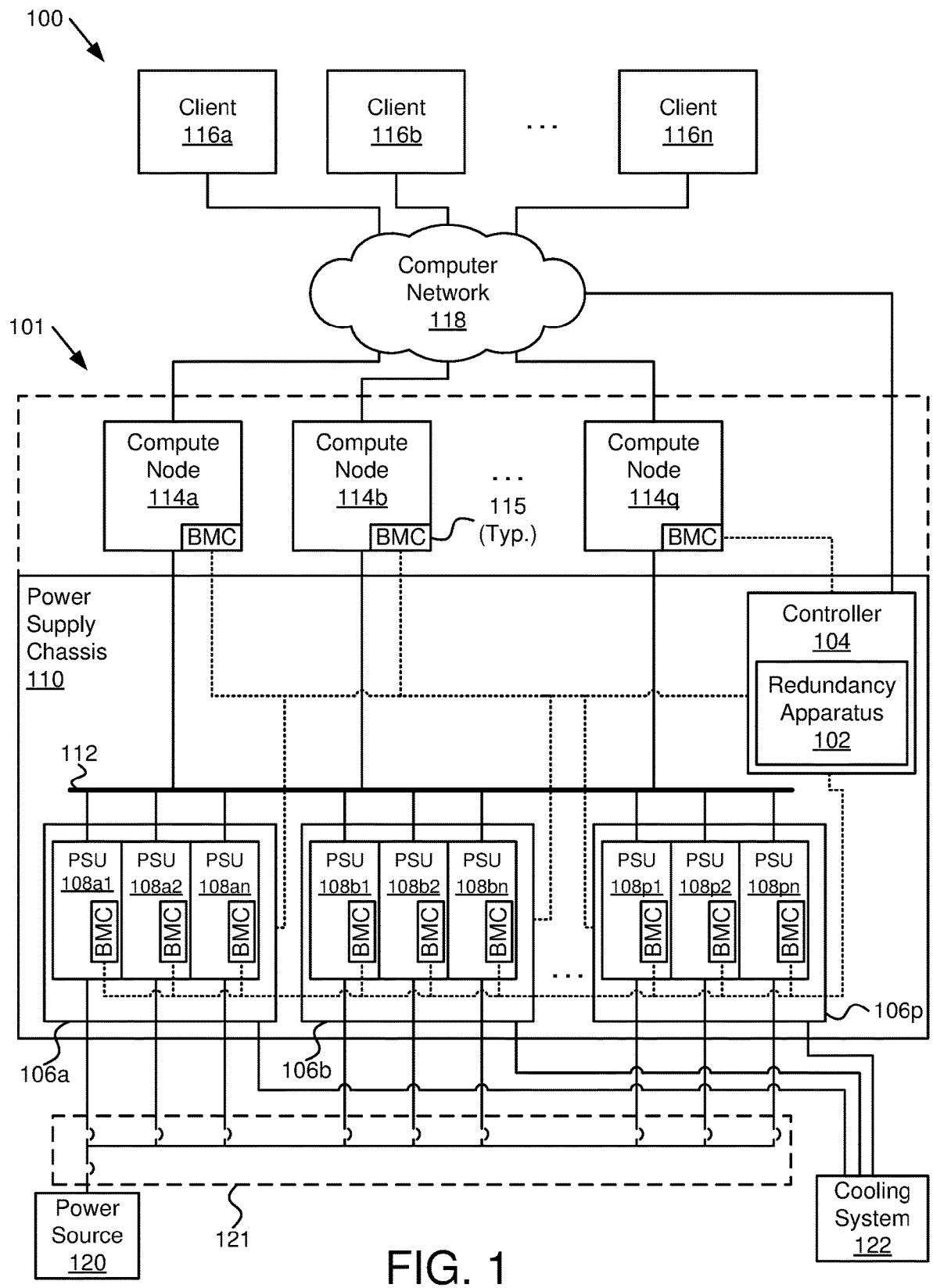
FIG. 1 is a schematic block diagram illustrating a system for allowing for higher usable power capacity for a redundant power configuration, according to various embodiments.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In certain embodiments, the storage devices only employ signals for accessing code.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

More specific examples (a non-exhaustive list) of the storage device would include the following: an electrical connection having one or more wires, a portable computer diskette, a hard disk, a random access memory (RAM), a read-only memory ("ROM"), an erasable programmable read-only memory ("EPROM" or "Flash memory"), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, R, Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of various embodiments.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiments. For instance, an arrow may indicate a waiting or monitoring period of unspecified duration between enumerated steps of the depicted embodiments. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C.

A method for allowing for higher usable power capacity for a redundant power configuration is disclosed. An apparatus and computer program product also perform the functions of the method. The method includes receiving a power supply unit ("PSU") replacement signal for a power supply chassis. The power supply chassis includes plurality of supply enclosures and each power supply enclosure includes a plurality of power supply units ("PSUs"). Each of the PSUs in the plurality of supply enclosures is connected to a power bus providing power to computing equipment connected to the power bus. The power supply chassis has a PSU redundancy policy with at least one PSU of the PSUs of the plurality of supply enclosures being redundant and the PSU replacement signal indicates that a user is about to replace a power supply enclosure. In response to the PSU replacement signal, the method includes calculating a power cap limit that is equal to or less than a capacity of the plurality of supply enclosures that are not being removed. Power consumption of the computing equipment is limited to the power cap limit. In response to detecting a replacement power supply enclosure, the method includes recalculating the power cap limit based on the PSUs of the plurality of supply enclosures including the replacement power supply enclosure. The power cap limit is in compliance with the PSU redundancy policy. Power consumption of the computing equipment is limited to the recalculated power cap limit.

In some embodiments, the method includes, prior to receiving the PSU replacement signal calculating a power cap limit that is in compliance with the PSU redundancy policy and is based on the PSUs of the plurality of supply enclosures being functional, and receiving a power supply alert indicative of a failure of one or more the PSUs of the plurality of supply enclosures. In the embodiments, in response to receiving the power supply alert, the method includes transmitting a power reduction command to reduce power consumption of the computing equipment to a minimum power consumption, identifying a number of PSUs that have failed, recalculating the power cap limit based on a current number of functional PSUs of the plurality of supply enclosures, and removing the power reduction command. Power consumption of the computing equipment is limited to the power cap limit in response to the power reduction command being removed.

In other embodiments, when the number of PSUs that have failed is less than the number of PSUs in the power supply enclosure with failed PSUs, before receiving the PSU replacement signal the power cap limit is set to a value higher than the power cap limit calculated based on a power capacity of the plurality of supply enclosures that are not being removed. In other embodiments, the power supply alert is generated by a PSU and, in response to the power supply alert, a controller identifies the number of PSUs that have failed. In some embodiments, the power cap limit with functional PSUs in the plurality of supply enclosures is based on one or more of the PSUs being redundant according to the PSU redundancy policy. In other embodiments, the power cap limit with a power supply enclosure removed for replacement is up to a maximum total capacity of P−1 power supply enclosures where P is the number of power supply enclosures. In other embodiments, the power cap limit with one or more failed PSUs and before receiving the PSU replacement signal is up to a maximum total capacity of the functional PSUs in the plurality of supply enclosures.

In some embodiments, the method includes, in response to the PSU replacement signal, transmitting a power reduction command to reduce power consumption of the computing equipment to a minimum power consumption where the power reduction command overrides the power cap limit, and removing the power reduction command in response to calculating the power cap limit that is equal to or less than a capacity of the plurality of supply enclosures that are not being removed. Power consumption of the computing equipment is limited to the power cap limit in response to the power reduction command being removed. In further embodiments, the computing equipment includes compute nodes and the power reduction command is a fast throttle command that reduces a clock speeds of processors, accelerators and/or graphics processing units ("GPUs") of the compute nodes to a minimum value.

In some embodiments, the computing equipment includes compute nodes and a controller regulates power consumption of the compute nodes to below the power cap limit by regulating clock speeds of processors, accelerators, and/or GPUs of the compute nodes. In other embodiments, the PSU replacement signal is generated by a button on the power supply chassis and/or an interface to a management application. In other embodiments, the computing equipment resides in the power supply chassis. In other embodiments, the plurality of PSUs of the plurality of supply enclosures includes M PSUs and the PSU redundancy policy is N+R, wherein M=N+R and R is one or more PSUs that are classified as redundant. In other embodiments, each of the plurality of supply enclosures is water cooled.

An apparatus for allowing for higher usable power capacity for a redundant power configuration includes a replacement signal detector configured to receive a PSU replacement signal for a power supply chassis. The power supply chassis includes plurality of supply enclosures and each power supply enclosure includes a plurality of PSUs. Each of the PSUs in the plurality of supply enclosures is connected to a power bus providing power to computing equipment connected to the power bus. The power supply chassis has a PSU redundancy policy with at least one PSU of the PSUs of the plurality of supply enclosures being redundant. The PSU replacement signal indicates that a user is about to replace a power supply enclosure. The apparatus includes a power cap calculator configured to, in response to the PSU replacement signal, the program code is executable by the processor to calculate a power cap limit that is equal to or less than a capacity of the plurality of supply enclosures that are not being removed. Power consumption of the computing equipment is limited to the power cap limit. The apparatus includes an enclosure detector configured to, in response to detecting a replacement power supply enclosure, the program code is executable by the processor to recalculate the power cap limit based on the PSUs of the plurality of supply enclosures including the replacement power supply enclosure. The power cap limit is in compliance with the PSU redundancy policy and power consumption of the computing equipment is limited to the recalculated power cap limit.

In some embodiments, prior to receiving the PSU replacement signal, the power cap calculator is further configured to calculate a power cap limit that is in compliance with the PSU redundancy policy and is based on the PSUs of the plurality of supply enclosures being functional, a power supply error detector configured to receive a power supply alert indicative of a failure of one or more the PSUs of the plurality of supply enclosures, and a power reduction command generator configure to, in response to receiving the power supply alert, transmit a power reduction command to reduce power consumption of the computing equipment to a minimum power consumption. In the embodiments, the apparatus includes a PSU availability analyzer configured to identify a number of PSUs that have failed, the power cap calculator is further configured to recalculate the power cap limit based on a current number of functional PSUs of the plurality of supply enclosures, and the power reduction command generator is further configured to remove the power reduction command. Power consumption of the computing equipment is limited to the power cap limit in response to the power reduction command being removed.

In other embodiments, the apparatus includes a power reduction command generator configured to, in response to the PSU replacement signal, transmit a power reduction command to reduce power consumption of the computing equipment to a minimum power consumption, where the power reduction command overrides the power cap limit, and the power reduction command generator is further configured to remove the power reduction command in response to calculating the power cap limit that is equal to or less than a capacity of the plurality of supply enclosures that are not being removed. Power consumption of the computing equipment is limited to the power cap limit in response to the power reduction command being removed.

In other embodiments, the power cap limit with the PSUs of the plurality of supply enclosures functional is based on one or more of the PSUs being redundant according to the PSU redundancy policy. In other embodiments, the power cap limit with a power supply enclosure removed for replacement is up to a maximum total capacity of P−1 power supply enclosures where P is the number of power supply enclosures. In other embodiments, the power cap limit with one or more failed PSUs and before receiving the PSU replacement signal is up to a maximum total capacity of the functional PSUs in the plurality of supply enclosures.

In some embodiments, the computing equipment includes compute nodes and the power reduction command is a fast throttle command that reduces a clock speeds of processors, accelerators, and/or GPUs of the compute nodes to a minimum value. In other embodiments, a controller regulates power consumption of the compute nodes to below the power cap limit by regulating clock speeds of processors, accelerators and/or GPUs of the compute nodes. In other embodiments, the PSU replacement signal is generated by a button on the power supply chassis and/or an interface to a management application.

A program product for allowing for higher usable power capacity for a redundant power configuration includes non-volatile storage with program code. The program code is configured to be executable by a processor to perform operations comprising receiving a PSU replacement signal for a power supply chassis. The power supply chassis includes plurality of supply enclosures and each power supply enclosure includes a PSUs. Each of the PSUs in the plurality of supply enclosures is connected to a power bus providing power to computing equipment connected to the power bus. The power supply chassis includes a PSU redundancy policy with at least one PSU of the PSUs of the plurality of supply enclosures being redundant and the PSU replacement signal indicates that a user is about to replace a power supply enclosure. The program code is further configured to, in response to the PSU replacement signal, perform operations comprising calculating a power cap limit that is equal to or less than a capacity of the plurality of supply enclosures that are not being removed. Power consumption of the computing equipment is limited to the power cap limit. The program code is further configured to, in response to detecting a replacement power supply enclosure, perform operations comprising recalculating the power cap limit based on the PSUs of the plurality of supply enclosures including the replacement power supply enclosure. The power cap limit is in compliance with the PSU redundancy policy and power consumption of the computing equipment is limited to the recalculated power cap limit.

In some embodiments, the program code is further configured to perform operations comprising, prior to receiving the PSU replacement signal, calculating a power cap limit that is in compliance with the PSU redundancy policy and is based on the PSUs of the plurality of supply enclosures being functional, receiving a power supply alert indicative of a failure of one or more the PSUs of the plurality of supply enclosures, transmitting a power reduction command to reduce power consumption of the computing equipment to a minimum power consumption, identifying a number of PSUs that have failed, recalculating the power cap limit based on a current number of functional PSUs of the plurality of supply enclosures, and removing the power reduction command. Power consumption of the computing equipment is limited to the power cap limit in response to the power reduction command being removed.

In other embodiments, the program code is further configured to perform operations comprising, in response to the PSU replacement signal, transmitting a power reduction command to reduce power consumption of the computing equipment to a minimum power consumption, where the power reduction command overrides the power cap limit, and removing the power reduction command in response to calculating the power cap limit that is equal to or less than a capacity of the plurality of supply enclosures that are not being removed. Power consumption of the computing equipment is limited to the power cap limit in response to the power reduction command being removed.

FIG. 1 is a schematic block diagram illustrating a system 100 for allowing for higher usable power capacity for a redundant power configuration, according to various embodiments. The system 100 includes a data system 101 with a redundancy apparatus 102 in a controller 104, P power supply enclosures 106a-106p (generically or collectively "106"), each with N power supply units ("PSUs") 108a1-108an, 108b1-108bn, . . . 108p1-108pn (generically or collectively "108"), a power supply chassis 110, a power bus 112, compute nodes 114a-114q (generically or collectively "114"), and baseboard management controllers ("BMCs") 115, and includes clients 116a-116n (generically or collectively "116"), a computer network 118, a power source 120, a power panel 121, and a cooling system 122, which are described below.

The system 100 includes a redundancy apparatus 102 in a controller 104. The redundancy apparatus 102 receives a power supply unit ("PSU") replacement signal from a user and the redundancy apparatus 102, in response to the PSU replacement signal, calculates a power cap limit equal to or less than a capacity of the power supply enclosures 106 subtracting out a capacity of a power supply enclosure 106 with a PSU that has failed. The controller 104 limits power consumption of the compute nodes 114 to less than or equal to the power cap limit. Once the redundancy apparatus 102 detects a replacement power supply enclosure, for example, once the replacement power supply has been connected, the redundancy apparatus 102 recalculates the power cap limit based on the PSUs of the P power supply enclosures that are functional. The power cap limit is based on a PSU redundancy policy. For example, for 9 PSUs, the PSU redundancy policy may be 8+1 so that one PSU is redundant. In another example, the PSU redundancy policy may be 7+2 for the 9 PSUs where two PSUs are redundant. In some embodiments, the redundancy apparatus 102 issues a power reduction command after receiving the PSU replacement signal to reduce power consumption to a minimum and then recalculates the power cap limit and then releases the power reduction command so that the controller 104 limits power consumption to the power cap limit.

In some embodiments, the redundancy apparatus 102, before receiving the PSU replacement signal, initially calculates a power cap limit with all of the PSUs of the system 100 being functional. This initial power cap limit is compliant with the PSU redundancy policy. The redundancy apparatus 102 receives a power supply alert signifying that there is a power supply problem and then sends a power reduction command, which quickly throttles power usage to a minimum level. The redundancy apparatus 102 then identifies how many PSUs have failed and, based on the number of PSUs that have failed, recalculates the power cap limit. For example, where there are 9 PSUs and a PSU redundancy policy of 8+1, initially the power cap limit is the power capacity of 8 PSUs. Where one PSU has failed, the redundancy apparatus 102 calculates the power cap limit to be capacity of a PSU times eight so there is no loss in power capacity. Thus, there is no throttling when on PSU fails. If the PSUs are each rated to 3 kilowatts ("kW"), the redundancy apparatus 102 calculates the power cap limit to be 8*3 kW=24 kW initially and after failure of one PSU. The redundancy apparatus 102 removes the power reduction command and the controller 104 then limits power consumption of the compute nodes 114 to 24 kW. This continues until a user pushes a button or changes a setting on a management console to input the PSU replacement signal, which may be days or weeks.

Returning to the example of 9 PSUs, there may be in three power supply enclosures so there are three PSUs per power supply enclosure. If one PSU fails, eight PSUs are available so the power cap limit is 24 kW. Once the PSU replacement signal is received, which signals that three PSUs will be unavailable, the power cap limit is reduced to 6*3 kW=18 kW until the replacement power supply enclosure is inserted. The power cap limit may then return to 24 kW. Advantageously, the redundancy apparatus 102 allows for higher power consumption until a technician is on-site with a replacement power supply enclosure and pushes a PSU replacement button, enters a PSU replacement command via a management console, etc. Thus, more power is available to the compute nodes 114 until the time when the actual replacement power supply enclosure is ready to be installed. The redundancy apparatus 102 is described further below with regards to the apparatuses 200, 300 of FIGS. 2 and 3.

In some embodiments, the power supply enclosures 106 are located in a power supply chassis 110. The power supply chassis 110 may also include a power bus 112 that feeds the compute nodes 114. In some embodiments, the compute nodes 114 are in the same chassis as the power supply enclosures 106 and power bus 112 (as indicated by the dashed lines) so that the power supply chassis 110 is expanded to include the elements of the data system 101. For example, the chassis of the data system 101 may include the compute nodes 114 that are accessible on one side of the chassis, a mid-plane that includes the power bus 112, and then power supply enclosures 106 on a back end of the chassis where the PSUs 108 of the power supply enclosures 106 feed the power bus 112. The power supply enclosures 106 and/or PSUs 108 are fed on the back end of the chassis from a power source 120. In the example, the compute nodes along with the power bus 112, power supply enclosures 106, etc. may be a pre-packaged computing solution for a datacenter.

The power source 120, may supply single phase alternating current ("AC") power, three-phase AC power, direct current ("DC") power, etc. In the system 100 of FIG. 1, the power source 120 feeds a panel 121 with circuit breakers, which feeds each PSU 108. A separate feed to each PSU 108 provides further redundancy. In other embodiments, each power supply enclosure 106 includes a single power connection that is split internally to provide power to each PSU 108. The power source 120, may be from a power utility, a cogeneration facility, solar panels, batteries in an uninterruptable power supply ("UPS"), or the like, and may include more than one power source. In some embodiments, the power source 120 is a panel with overcurrent protection for each PSU 108 or power supply enclosure 106. In other embodiments, each power supply enclosure 106 and/or PSU 108 includes overcurrent protection.

Each PSU 108, in some embodiments, converts AC input power to a particular DC voltage, such as 12 volts ("V"). In other embodiments, the data system 101 includes multiple power busses 112 at different DC voltages and each PSU 108 includes more than one output voltage. In some embodiments, the PSUs 108 are switching power supplies that include switches that are integrated circuits. In other embodiments, each PSU 108 includes a rectification section that converts incoming AC voltage to a DC voltage at an intermediate DC link and each PSU 108 then includes a DC-to-DC converter. In some embodiments, each PSU includes an active power factor correction circuit that includes switching components that converts the AC input voltage to a DC voltage with unity power factor and minimal harmonics. Due the complexities of switching power converters, it is common for a PSU 108 to fail. Typically, power supply failure is more likely than failure of less complex components, such as power wiring, connections to the power bus 112, terminals, etc. Often, PSUs 108 are monitored for failure so that the controller 104 and/or redundancy apparatus 102 can take action before a PSU 108 failure causes a cascading failure due to power consumption being higher than what is available from the PSUs 108.

Often, PSUs 108 include diagnostics. Each PSU 108 also includes hardware that typically transmits a power supply alert signal upon detection of a problem that may affect power availability from the PSU 108. The hardware, in some embodiments, transmits the power supply alert signal quickly which triggers action by the controller 104 to either read information in the power supply alert signal to determine a status of the PSU 108 or to interrogate the PSU 108 to diagnose a problem. In some embodiments, the PSU 108 sends the power supply alert even on total loss of power to the PSU 108. For example, the power supply alert may be an interrupt signal that is high during normal conditions and goes low, which is the power supply alert signal. In some embodiments, the redundancy apparatus 102 takes action to limit power consumption based on this power supply alert before determining the nature of the problem that caused the power supply alert to be sent.

In the embodiments depicted in the system 100 of FIG. 1, the PSUs 108 are connected to the power bus 112. Typically, the PSUs 108 are connected in parallel to the power bus 112. In some embodiments, a private bus includes a voltage signal for voltage control of the PSUs 108 and the private bus is part of a voltage control loop. In the embodiments, current is controlled for each PSU 108 to balance power and/or current output. In other embodiments, power sharing differs between the PSUs 108.

In the embodiments described herein, each power supply enclosure 106 includes two or more PSUs 108. Often, power supply enclosures 106 provide a significant amount of power, such as 9 kW, so including more than one PSU 108 provides a mechanism to provide the high amount of power required for a power supply enclosure. In some embodiments, the power supply enclosures 106 are water cooled or have some other mechanism to remove heat to a cooling system 122. In other embodiments, the working fluid of the cooling system 122 is another liquid.

Often in systems similar to the system 100 of FIG. 1, having individually replaceable PSUs 108 is impractical due to connection space at the back of the power supply chassis 110. For example, having individually replaceable PSUs 108 would require a cooling connection to each PSU 108 along with other power connections, communication connections, etc. Thus, having a power supply enclosure 106 with multiple PSUs 108 makes sense in many circumstances. The redundancy apparatus 102 takes advantage of this architecture to provide as much power as possible after a failure of a PSU 108 and only further limits power during the brief time period when a replacement power supply enclosure 106 is installed.

In the system 100, the cooling system 122 includes liquid connections to each power supply enclosure 106 that circulate water or other suitable cooling fluid so that heat generated from the PSUs 108 is transported externally. For example, the data system 101 with compute nodes 114, power bus 112 and power supply enclosures 106 or the power supply chassis 110 with at least the power supply enclosures 106 may be in a room of a datacenter so that transferring heat to the air in the datacenter may be undesirable. The cooling system 122, in some embodiments, facilitates removing heat from the room of the datacenter to another location, such as a heat exchanger, cooling tower, etc.

The system 100 includes clients 116 connected to the compute nodes 114 via a computer network 118. While compute nodes 114 are depicted in the system 100 of FIG.

1, in other embodiments the power bus 112 feeds other computing equipment, such as data storage devices, routers, switches, a mainframe computer, workstations, desktop computers, or any other equipment connected to a power bus 112 fed by PSUs 108. Typically, some or all of the compute nodes 114 or other computing equipment includes a connection to a computer network 118. In some embodiments, the clients 116 submit workloads to the compute nodes 114 or other computing equipment. In some embodiments, the compute nodes 114 or other computers include virtual machines and the workloads run on the virtual machines. For example, the compute nodes 114 or computing equipment may be part of a cloud computing environment. In other embodiments, the compute nodes 114 and/or computing equipment is part of a private datacenter, part of an edge computing system, or other system that includes a power bus 112 fed from PSUs 108 in power supply enclosures 106. One of skill in the art will recognize other systems with a power bus 112 fed by PSUs 108 in power supply enclosures 106 that may benefit from use of a redundancy apparatus 102.

The computer network 118 may include any suitable wired network and/or wireless connection. The computer network 118 may include public and/or private computer networks in any number and/or configuration, including the Internet, an intranet, a cloud network, etc. that is known or developed in the future that connects the clients 116 to the compute nodes 114 or other computing equipment fed by the power bus 112. In various embodiments, the computer network 118 may include a cloud network (e.g. internet area network ("IAN")), a storage area network ("SAN"), a wide area network ("WAN"), a local area network ("LAN"), a wireless local area network ("WLAN"), a virtual private network ("VPN"), a personal area network ("PAN"), among other examples of computing networks and/or or sets of computing equipment connected together for the purpose of communicating and/or sharing resources that are possible and contemplated herein.

The wireless connection may be a mobile telephone network. The wireless connection may also employ a Wi-Fi network based on any one of the Institute of Electrical and Electronics Engineers ("IEEE") 802.11 standards. Alternatively, the wireless connection may be a BLUETOOTH® connection. In addition, the wireless connection may employ a Radio Frequency Identification ("RFID") communication including RFID standards established by the International Organization for Standardization ("ISO"), the International Electrotechnical Commission ("IEC"), the American Society for Testing and Materials® ("ASTM"®), the DASH7™ Alliance, and EPCGlobal™.

Alternatively, the wireless connection may employ a ZigBee® connection based on the IEEE 802 standard. In some embodiments, the wireless connection employs a Z-Wave® connection as designed by Sigma Designs®. Alternatively, the wireless connection may employ an ANT® and/or ANT-+® connection as defined by Dynastream® Innovations Inc. of Cochrane, Canada. The wireless connection may be an infrared connection including connections conforming at least to the Infrared Physical Layer Specification ("IrPHY") as defined by the Infrared Data Association® ("IrDA"®). Alternatively, the wireless connection may be a cellular telephone network communication. All standards and/or connection types include the latest version and revision of the standard and/or connection type as of the filing date of this application.

The controller 104 communicates with various components of the data system 101 and is capable of controlling power consumption of the computing equipment connected to the power bus 112, such as the compute nodes 114. In some embodiments, the PSUs 108, compute nodes 114 and other computing equipment of the data system 101 each include a BMC 115 which are connected to the controller 104 over a management network. In other embodiments, the power supply enclosures each include a BMC 115 and the BMC 115 in a power supply enclosure manages each PSU 108 of the power supply enclosure. In other embodiments, the PSUs 108 and the power supply enclosures 106 each include a BMC 115. The management network, in some embodiments, is a back channel network and allows access to the compute nodes 114, the PSUs 108, storage devices, and other computing equipment of the data system 101 for management functions. The management network also include a LAN, a WAN, wireless connection, etc. but is typically a private network or includes a secure connection between the controller 104 and the BMC 115. The management network is often an ethernet connection.

Often the management network uses a management-specific protocol, such as Intelligent Platform Management Interface ("IPMI"), Redfish, Simple Network Management Protocol ("SNMP"), and the like. The controller 104 is a computing device accessible to a system administrator that connects to the BMCs 115 over the management network. The controller 104 includes any computing device capable of running system management software for managing the PSUs 108. The controller 104 is depicted in the power supply chassis 110 but may be located somewhere in the data system 101. In some embodiments, the controller 104 is external to the chassis of the data system 101. The controller 104 is sufficiently close to the PSUs 108, compute nodes 114 and other computing equipment of the data system 101 to act quickly enough to handle power supply alerts, issue power reduction alerts, to manage power consumption of the computing equipment of the data system 101, and the like.

In some embodiments, the controller 104 is connected to a BMC 115 in each compute node 210, each PSU 108, each storage device, and possibly to other equipment in the data system 101. A BMC 115 is provided in the compute nodes 114, storage devices 212 and other devices typically for management functions. A BMC 115 may provide access, for example to a compute node 114, when the compute node 114 is running or not running. Likewise, the BMC 115 may provide access to the PSUs 108 whether running or not. For example, the BMC 115 may be used to install firmware on the compute nodes 114, PSUs 108, storage devices, etc. In some embodiments, the BMCs 115 are referred to as service processors. The BMC 115 is typically small and may be a system on a chip solution. The BMC 115 may also be used for management and monitoring of other physical devices of the compute nodes 114, PSUs 108, etc., such as for fans, processors, etc. and for other telemetry functions, such as temperature monitoring. In some embodiments, the BMC 115 is an XClarity® Controller ("XCC") by Lenovo®. In other embodiments, the BMC 115 is an Integrated Management Module ("IMM") by IBM®. One of skill in the art will recognize other forms of a BMC 115 that may be used with the embodiments described herein.

Figure 2:
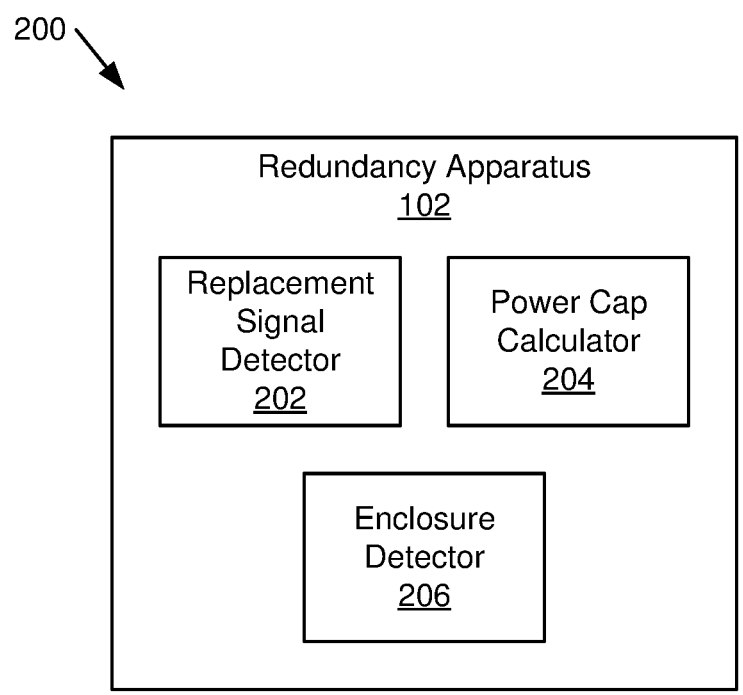
FIG. 2 is a schematic block diagram illustrating an apparatus for allowing for higher usable power capacity for a redundant power configuration, according to various embodiments.

FIG. 2 is a schematic block diagram illustrating an apparatus 200 for allowing for higher usable power capacity for a redundant power configuration, according to various embodiments. The apparatus 200 includes a redundancy apparatus 102 with a replacement signal detector 202, a power cap calculator 204, and an enclosure detector 206, which are described below. In some embodiments, the apparatus 200 is implemented with program code executable by a processor of the controller 104. In other embodiments, the apparatus 200 is implemented with a programmable hardware device, such as an FPGA. In other embodiments, all or a portion of the apparatus 200 is implemented with hardware circuits. For example, the apparatus 200 may include a PSU replacement button that provides the PSU replacement signal. In some embodiments, the controller 104 is a custom controller with the apparatus 200 implemented by the custom controller. In other embodiments, functions that the apparatus 200 relies upon, such as detecting a power supply alert, issuing a power reduction command, etc. are functions built into the controller 104 and the redundancy apparatus 102 is implemented in program code and is capable of accessing the built-in functionality of the controller 104. One of skill in the art will recognize other ways to implement the apparatus 200.

The apparatus 200 includes a replacement signal detector 202 configured to receive a PSU replacement signal for a power supply chassis 110. The power supply chassis 110 includes P power supply enclosures 106 and each power supply enclosure 106 includes a plurality of PSUs 108. P is an integer greater than one so there are two or more power supply enclosures 106 in the power supply chassis 110. For example the power supply chassis 110 may include three power supply enclosures 106 with each power supply enclosure 106 having three PSUs 108. Each of the PSUs 108 in the P power supply enclosures 106 is connected to a power bus 112 providing power to computing equipment connected to the power bus 112, such as compute nodes 114.

The power supply chassis 110 includes a PSU redundancy policy with at least one PSU (e.g. 108a1) of the PSUs 108 of the P power supply enclosures 106 being redundant. A typical redundancy policy for power supplies allows for one or more of the power supplies to be considered redundant so that if a power supply fails, the other power supplies are available. In some redundancy policies, one of the power supplies is in an off state or is available as a hot standby. In other redundancy policies, all power supplies provide power and the redundancy policy merely limits power so that the equivalent of one or more power supplies may fail without reducing the available power.

Typically, a redundancy policy may be expressed in terms of N power supplies in use and M power supplies being redundant, e.g. N+M. To avoid confusion with other uses of variables, as used herein there are M PSUs 108, P power supply enclosures 106 and R redundant PSUs. So a PSU redundancy policy may be expressed as N+R where M=N+R and R is an integer that is one or more. Also, R is less than N and is typically less than half of N. For nine power supplies, one possible PSU redundancy policy may be 8+1 where eight PSUs 108 are in use and one PSU 108 is considered as backup or redundant. For this 8+1 PSU redundancy policy, the power cap limit would be the available power for eight PSUs 108. If one PSU 108 fails (e.g. PSU 108a1 fails), then the power cap limit is still maintained to be eight times the available power capacity of each PSU 108. Where each PSU 108 supplies 3 kW, the power cap limit would be 8*3 kW=24 kW. However, if two PSUs 108 fail, 24 kW is not guaranteed and the power cap limit is reduced accordingly. Typically, the power cap limit is maintained for up to M PSU 108 failures where M is the number of redundant PSUs 108. In other embodiments, the PSUs 108 may not all have the same capacity and calculating a power cap limit might include summing the capacity of each PSU 108.

The PSU replacement signal indicates that a user is about to replace a power supply enclosure 106. In some embodiments, the PSU replacement signal is received from a physical button on the power supply chassis 110, from a chassis of the data system 101, or other location near the power supply chassis 110. For example, a button may be formed into a control panel or other convenient location in the chassis of the data system 101. In other embodiments, the PSU replacement signal is from an activation by a user through a management console. The management console, in some embodiments, includes a setting, a button on a display or touchscreen, a box that can be checked in a management console display, or the like. In various embodiments, the management console is located at the data system 101, at a location convenient to the data system 101, or other location away from the data system 101. Once the user activates the button, setting, check box, etc., the management console or other device generates the PSU replacement signal and the replacement signal detector 202 receives the PSU replacement signal.

In some embodiments, the replacement signal detector 202 is in the controller 104 and is connected to a line that transitions low to high, high to low, receives a pulse, etc. to receive the PSU replacement signal. In other embodiments, the replacement signal detector 202 receives data that corresponds to the PSU replacement signal. One of skill in the art will recognize other ways for the replacement signal detector 202 to receive the PSU replacement signal.

The apparatus 200 includes a power cap calculator 204 configured to, in response to the PSU replacement signal, calculate a power cap limit that is equal to or less than a capacity of the P power supply enclosures 106 without the power supply enclosure 106 being removed. For example, where a failed PSU 108 is in the first power supply enclosure 106a of P power supply enclosures 106a-16n, the power cap calculator 204 calculates the power cap limit to be the capacity of the remaining power supply enclosures 106b-106n. If there are three power supply enclosures (e.g. 106a, 106b, 106c) and each includes three PSUs 108 and each PSU 108 has a 3 kW capacity, then each power supply enclosure 106 has a capacity of 9 kW. If the failed PSU 108 is PSU 108a1, then the entire first power supply enclosure 106a will be removed leaving the other two power supply enclosures 106b, 106c. The power cap calculator 204 calculates the power cap limit as the capacity of the two remaining power supply enclosures 106b, 106c, each of which includes three PSUs 108. The power cap limit is then 6*3 kW=18 kW. The controller 104 then limits power consumption of the computing equipment to the power cap limit.

In some embodiments, the controller 104 limits power consumption of the computing equipment, such as the compute nodes 114, by controlling clock speed of the processors, graphics processing unit ("GPU"), accelerators, etc. Typically, slowing a clock speed of a processor, accelerator, GPU or similar device also indirectly limits power consumption of memory and other devices, busses, etc. attached to or controlled by the processors, accelerators, GPUs, etc. In some embodiments, the controller 104 controls power consumption of the computing equipment using a proportional control scheme where clock speeds of various devices of the computing equipment are controlled on a proportional basis over a range from a maximum to a minimum clock speed. For example, a processor may have a range $R_c$ of clock speeds from $C_{pmin}$ to $C_{pmax}$ and a GPU may have a clock speed range $R_g$ from $C_{gmin}$ to $C_{gmax}$ so a command from the controller 104 to limit the clock speeds to 80% would be $0.8*R_p$ for the processor and $0.8*R_g$ for the processor.

Other proportional control schemes include different ratios for different devices or may include a more complex equation for each device with a clock speed adjustment. In other embodiments, the controller 104 controls power consumption in other ways, such as throttling some of the computing equipment of the data system 101 while leaving other equipment functional. The power cap limit is a limit where actual power consumption of the computing equipment of the data system 101 is allowed to drop below the power cap limit. For example, where workloads do not require the computing equipment to be at the power cap limit, the controller 104 allows the computing equipment to draw whatever power that is needed to service workloads and only acts to limit power consumption when the power consumption of the computing equipment approaches the power cap limit.

In some embodiments, the controller 104 allows power consumption of the computing equipment to briefly exceed the power cap limit. In some examples, the PSUs 108 are sized to allow for brief power excursions beyond 100% of rated power. For example, a PSU 108 may be rated to be able to withstand up to 125% of rated power for a short period of time. In some embodiments, the controller 104 reacts to power consumption over the power cap limit and takes some time to control power consumption of the computing equipment. Depending on the bandwidth of the control loop for controlling power consumption, the power consumption of the computing equipment may exceed the power cap limit for a period of time.

In other embodiments, the bandwidth of the power consumption control loop is fast and the controller 104 allows power consumption of the power cap limit up to a threshold amount of time and up to a power consumption limit that is beyond the power cap limit. For example, the controller 104 may allow up to 125% power consumption for up to 30 seconds even though the controller 104 is able to limit power consumption quicker than 30 seconds. Excursions above 100% of rated power for the PSUs 108 is beneficial to not reduce clock speed for power consumption above 100% for a short period of time. One of skill in the art will recognize other ways for the controller 104 to limit power consumption of the computing equipment of the data system 101.

Note that while the description above is for the controller 104 limiting power consumption of the computing equipment, in some embodiments, the redundancy apparatus 102 includes functionality limit power consumption directly or to cause the controller 104 to limit power consumption of the computing equipment. In some embodiments, the power cap calculator 204 calculates a power cap limit and then causes the controller 104 to limit power consumption of the computing equipment.

The apparatus 200 includes an enclosure detector 206 configured to detect a replacement power supply enclosure (e.g. 106a). For example, after the replacement power supply enclosure 106a is installed, the enclosure detector 206, in some embodiments, detects that the replacement power supply enclosure 106a is functional and ready to produce power or already is producing power. Typically, once the replacement power supply enclosure 106a is inserted, there is some installation routine that is executed to bring the replacement power supply enclosure 106a online. For example, the replacement power supply enclosure 106a may go through a startup routine and the controller 104 may then go through an installation process to gather information from the replacement power supply enclosure 106a, to check functionality, to direct the replacement power supply enclosure 106a to produce power, etc.

In some examples, the enclosure detector 206 participates in the startup process of the replacement power supply enclosure 106a and gathers information about the replacement power supply enclosure 106a. For example, the enclosure detector 206 may query the replacement power supply enclosure 106a for information about a maximum capacity, number of PSUs 108, serial number, media access control ("MAC") address, status of each PSU 108a1-108an, etc. In other embodiments, the enclosure detector 206 merely receives a signal that the replacement power supply enclosure 106a is functional and other elements of the redundancy apparatus 102 gather or have information about the replacement power supply enclosure 106a, such as number of PSUs 108, power capacity, etc.

In response to the enclosure detector 206 detecting the replacement power supply enclosure 106a, the power cap calculator 204 recalculates the power cap limit based on the PSUs 108 of the P power supply enclosures (e.g. 106a-106n), including the replacement power supply enclosure 106a. The power cap limit is in compliance with the PSU redundancy policy and the controller 104, redundancy apparatus 102, and/or power cap calculator 204 limits power consumption of the computing equipment to the recalculated power cap limit. Where the PSU redundancy policy has a single redundant PSU 108, the power cap calculator 204 adds up the capacities of all but one PSU 108. For example, where there are 9 PSUs 108 each with a 3 kW capacity and the PSU redundancy policy is 8+1, the power cap calculator 204 calculates the power cap limit as 8*3 kW=24 kW. Thus, the power capacity of the data system 101 returns to maximum capacity of the PSU redundancy policy once the replacement power supply enclosure 106a is installed.

Figure 3:
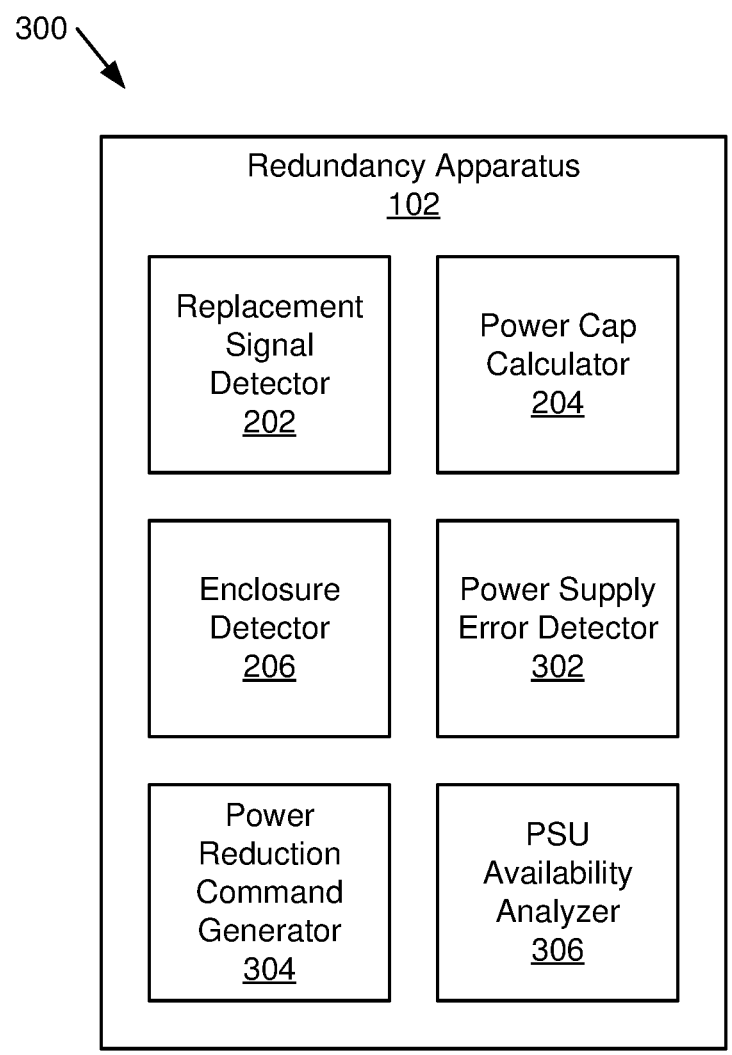
FIG. 3 is a schematic block diagram illustrating another apparatus for allowing for higher usable power capacity for a redundant power configuration, according to various embodiments.

FIG. 3 is a schematic block diagram illustrating another apparatus 300 for allowing for higher usable power capacity for a redundant power configuration, according to various embodiments. The apparatus 300 includes another redundancy apparatus 102 with a replacement signal detector 202, a power cap calculator 204 and an enclosure detector 206, which are substantially similar to those describe above in relation to the apparatus 200 of FIG. 2. The apparatus 300, in various embodiments, includes a power supply error detector 302, a power reduction command generator 304 and/or a PSU availability analyzer 306, which are described below. The apparatus 300, in various embodiments, is implemented in a similar way as the apparatus 200 of FIG. 2.

In some embodiments, the power cap calculator 204 calculates a power cap limit that is in compliance with the PSU redundancy policy and is based on the PSUs 108 of the P power supply enclosures 106 being functional. In some embodiments, the power cap calculator 204 calculates the power cap limit during initial startup of the data system 101. In other embodiments, the power cap calculator 204 calculates the power cap limit after a replacement power supply enclosure 106 is installed. In other embodiments, the power cap calculator 204 calculates the power cap limit upon implementation of a new PSU redundancy policy. In other embodiments, the power cap calculator 204 calculates the power cap limit based on user input. One of skill in the art will recognize other ways and appropriate times for the power cap calculator 204 to calculate a power cap limit.

The apparatus 300 includes, in some embodiments, a power supply error detector 302 configured to receive a power supply alert indicative of a failure of one or more the PSUs 108 of the P power supply enclosures 106. In some embodiments, each PSU 108 is configured to send a power supply alert upon detection of a problem that could impact power output. For example, a PSU 108 may experience a failure of a switch and may then send a power supply alert. In other embodiments, the PSU 108 sends the power supply alert when the PSU 108 stops producing power, such as when the PSU 108 is disconnected for some reason.

In some embodiments, each PSU 108 includes a power supply alert output that is an analog signal and may vary between a low and a high signal and the power supply error detector 302 detects a voltage level of a power supply alert line. The high signal may be present when the PSU 108 is functioning normally and may go low upon detection of a problem with the PSU 108. The power supply error detector 302 may be connected to the power supply alert output of each of the PSUs 108 and receives the power supply alert over a line connected to the power supply alert outputs. In some examples, the power supply alert outputs of the PSUs 108 are combined with an OR gate or are simply connected together into a single line connected to the power supply error detector 302. In other embodiments, each PSU 108 sends the power supply alert as a digital signal and the power supply error detector 302 receives and interprets information in the power supply alert.

The apparatus 300, in some embodiments, includes a power reduction command generator 304 configured to, in response to the power supply error detector 302 receiving the power supply alert, transmit a power reduction command to reduce power consumption of the computing equipment to a minimum power consumption. In the embodiments, the power reduction command overrides the power cap limit. The power reduction command, in some embodiments, is configured to reduce power consumption of the computing equipment to a minimum allowable level. For example, the controller 104 may send a signal to the computing equipment to reduce clock speed to a minimum. In other embodiments, the minimum power consumption is a value input by a user. In other embodiments, the minimum power consumption is a calculated value based on a number of power supply enclosures 106, a number of PSUs 108 in each power supply enclosure 106, etc. For example, the minimum power consumption may be a level that is a certain percentage of the power cap limit, such as 50%. In some embodiments, the power reduction command is a fast throttle command that quickly reduces clock speeds of the computing equipment to a minimum clock speed. One of skill in the art will recognize other forms of a power reduction command.

In some embodiments, the power reduction command generator 304 transmits a power reduction command to the controller 104 and the controller sends out a fast throttle command or other command to limit power consumption of the computing equipment of the data system 101. In other embodiments, the power reduction command generator 304 sends out the power reduction command to the computing equipment. In some examples, the power reduction command generator 304 sends out a fast throttle signal to the computing equipment, such as the compute nodes 114, to reduce clock speed to a minimum value. In some embodiments, the power reduction command generator 304 sends the power reduction command in response to the power supply error detector 302 receiving a power supply alert from one or more of the PSUs 108.

The apparatus 300, in various embodiments, includes a PSU availability analyzer 306 configured to identifying a number of PSUs 108 that have failed. In some embodiments, the PSU availability analyzer 306 identifies the number of failed PSUs 108 in response to power supply alert. In other embodiments, the PSU availability analyzer 306 identifies the number of failed PSUs 108 in response to the power reduction command generator 304 transmitting the power reduction command.

In some embodiments, the PSU availability analyzer 306 communicates or attempts to communicate with each PSU 108 to determine how many PSUs 108 have failed. In other embodiments, the PSU availability analyzer 306 reads information from one or more power supply alerts to determine which PSU 108 sent the power supply alert and determines that each PSU 108 sending a power supply alert has failed. In other embodiments, the PSU availability analyzer 306 read information from the one or more power supply alerts or communicates with the PSUs 108 that sent a power supply alert to determine a status of the PSUs 108 sending the power supply alerts. In other embodiments, the PSU availability analyzer 306 triggers the controller 104 to determine which PSUs 108 have failed. The controller 104, in the embodiments, includes functionality to determine a status of each PSU 108 and the PSU availability analyzer 306 triggers the controller 104 to determine PSU 108 availability. Typically, identifying a number of PSUs 108 that have failed takes longer than issuing the power reduction command so the power reduction command generator 304 sending the power reduction command quickly reduces power consumption while the PSU availability analyzer 306 assesses which PSUs 108 have failed.

Once the PSU availability analyzer 306 has identified the number of PSUs 108 that have failed, the power cap calculator 204 again calculates the power cap limit based on a current number of functional PSUs 108 of the P power supply enclosures 106. For example, if the PSU availability analyzer 306 determines that one PSU 108 has failed and the PSU redundancy policy is N+1, the power cap calculator 204 calculates the power cap limit as N PSUs 108 multiplied by the capacity of the PSUs 108. Where the PSU availability analyzer 306 determines that two PSUs 108 have failed and the PSU redundancy policy is N+1, the power cap calculator 204 calculates the power cap limit as (N−1)*PSU capacity or sums up the power capacity of the functional PSUs 108.

As an example, where there are 9 PSUs 108 each with a capacity of 3 kW and the PSU redundancy policy is 8+1, when one PSU 108 has failed the power cap calculator 204 calculates the power cap limit as 8*3 kW=24 kW. Where two PSUs 108 have failed, the power cap limit as 7*3 kW=21 kW. If the PSU redundancy policy is N+2, and one or two PSUs 108 have failed, the power cap calculator 204 calculates the power cap limit as N PSUs 108 multiplied by the capacity of the PSUs 108. Continuing with the example above of 9 PSUs 108 with a capacity of 3 kW each and a PSU redundancy policy of 7+2, for either one PSU 108 failure or two PSU 108 failures, the power cap calculator 204 calculates the power cap limit as 7*3 kW=21 kW.

Once the power cap limit has been recalculated, the power reduction command generator 304 removes the power reduction command. The power cap calculator, the redundancy apparatus 102 and/or the controller 104 limits power consumption of the computing equipment to the power cap limit. Typically, the power cap limit after a failure of one or more PSUs 108 is higher than the power cap limit after the replacement signal detector 202 receives the PSU replacement signal.

In current designs where a power supply enclosure is considered as a whole, there is no ability to keep some un-failed PSUs in the power supply enclosure functional after failure of a PSU. Instead, the entire power supply enclosure is considered non-functioning and the power cap limit would be the capacity of the remaining functioning power supply enclosures. The embodiments described herein allow all functional PSUs 108 to be considered for the power cap limit after failure of a PSU 108, even those in a power supply enclosure 106 with the failed PSU 108. The embodiments described herein also allow for a technician replacing a power supply enclosure 106 to temporarily lower the power cap limit while the replacement power supply enclosure 106 is being installed so that the data system 101 has a reduced power capacity for a limited amount of time.

In some embodiments, the power reduction command generator 304 transmitting a power reduction command after the replacement signal detector 202 receives a PSU replacement signal is beneficial to allow the power cap calculator 204 time to calculate the power cap limit. In other embodiments, the power cap calculator 204 is fast enough so that the power reduction command is not needed. In other embodiments, the PSU replacement command triggers an action to prevent removal of the power supply enclosure 106 with a failed PSU 108 before the power cap calculator 204 acts to calculate a power cap limit and power consumption is limited by the power cap calculator 204, the redundancy apparatus 102 and/or the controller 104.

In embodiments where the power reduction command is issued in response to the PSU replacement signal, the power reduction command generator 304 transmits a power reduction command to reduce power consumption of the computing equipment to a minimum power consumption. In the embodiments, the power reduction command overrides the power cap limit so that power consumption is limited to the minimum power consumption. The power reduction command generator 304 transmitting the power reduction command in response to the replacement signal detector 202 receiving the PSU replacement signal, in some embodiments, is beneficial to reduce power consumption before a technician can remove the power supply enclosure 106 with the failed PSU 108, which may happen quickly.

The power reduction command generator 304 removes the power reduction command in response to the power cap calculator 204 calculating the power cap limit that is equal to or less than a capacity of the P power supply enclosures 106 that are not being removed. The power cap calculator 204, the redundancy apparatus 102 and/or the controller 104 then limits power consumption of the computing equipment to the power cap limit.

Figure 4:
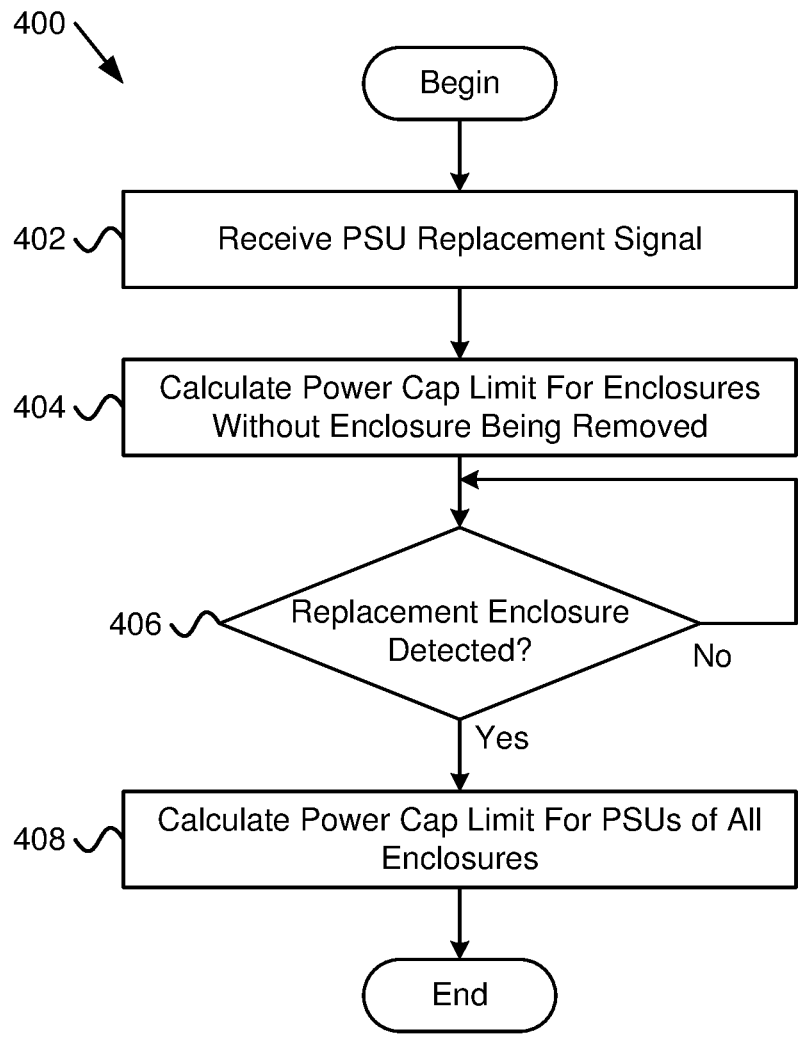
FIG. 4 is a schematic flow chart diagram illustrating a method for allowing for higher usable power capacity for a redundant power configuration, according to various embodiments.

FIG. 4 is a schematic flow chart diagram illustrating a method 400 for allowing for higher usable power capacity for a redundant power configuration, according to various embodiments. The method 400 begins and receives 402 a PSU replacement signal for a power supply chassis 110. The power supply chassis 110 includes P power supply enclosures 106 and each power supply enclosure 106 includes a plurality of PSUs 108. P is an integer greater than one and each of the PSUs 108 in the P power supply enclosures 106 is connected to a power bus 112 providing power to computing equipment connected to the power bus 112. The power supply chassis 110 has a PSU redundancy policy with at least one PSU 108 of the PSUs 108 of the P power supply enclosures 106 being redundant. The PSU replacement signal indicates that a user is about to replace a power supply enclosure 106.

The method 400 calculates 404 a power cap limit that is equal to or less than a capacity of the P power supply enclosures 106 that are not being removed (e.g. 106b-106p). Power consumption of the computing equipment is limited to the power cap limit. The method 400 determines 406 if a replacement power supply enclosure 106 is detected. If the method 400 determines 406 that a replacement power supply enclosure 106 is not detected, the method 400 returns and continues to determine 406 if a replacement power supply enclosure 106 is detected. If the method 400 determines 406 that a replacement power supply enclosure 106 is detected, the method 400 recalculates 408 the power cap limit based on the PSUs 108 of the P power supply enclosures 106 including the replacement power supply enclosure 106, and the method 400 ends. The power cap limit is in compliance with the PSU redundancy policy and power consumption of the computing equipment is limited to the recalculated power cap limit. In various embodiments, all or a portion of the method 400 is implemented with the replacement signal detector 202, the power cap calculator 204 and/or the enclosure detector 206.

Figure 5A:
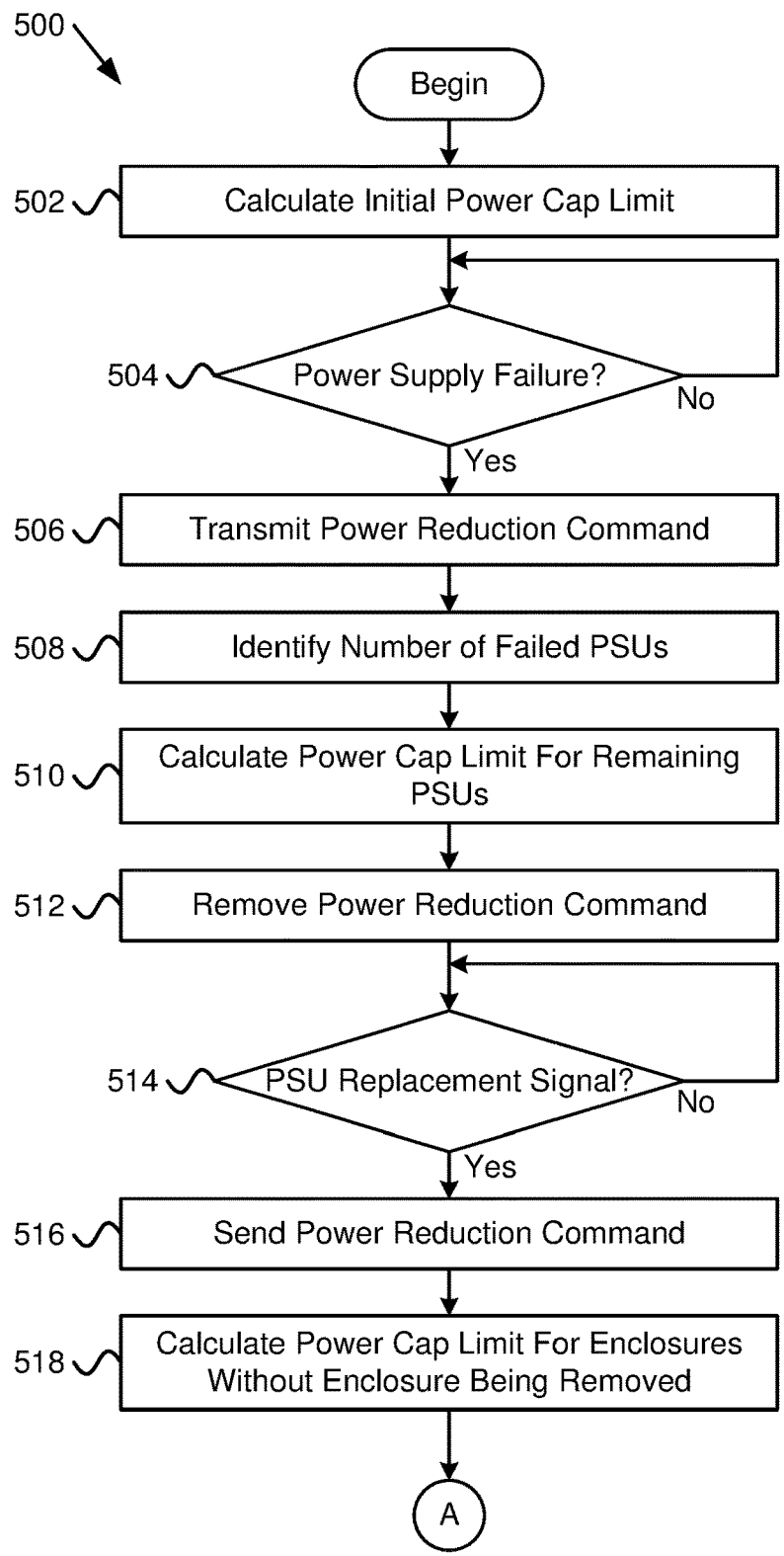
FIG. 5A is a first part of a schematic flow chart diagram illustrating another method for allowing for higher usable power capacity for a redundant power configuration, according to various embodiments.
Figure 5B:
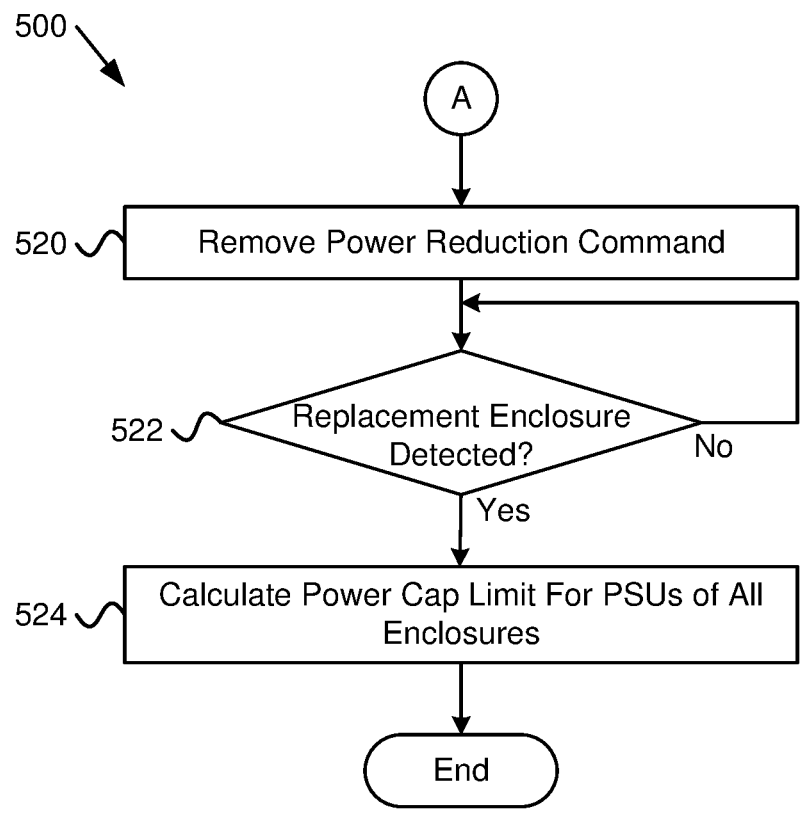
FIG. 5B is a second part of the schematic flow chart diagram of the method of FIG. 5A.

FIG. 5A is a first part and FIG. 5B is a second part of a schematic flow chart diagram illustrating another method 500 for allowing for higher usable power capacity for a redundant power configuration, according to various embodiments. The method 500 begins and calculates 502 an initial power cap limit that is in compliance with a PSU redundancy policy and is based on PSUs 108 of P power supply enclosures 106 being functional. The P power supply enclosures 106 are in a power supply chassis 110 and each power supply enclosure 106 includes a plurality of PSUs 108. P is an integer greater than one. The PSU redundancy policy includes at least one PSU 108 as redundant and the PSUs 108 of the P power supply enclosures 106 are connected to a power bus 112 feeding computing equipment connected to the power bus 112.

The method 500 determines 504 if a power supply alert has been received where the power supply alert is indicative of a failure of one or more the PSUs 108 of the P power supply enclosures 106. If the method 500 determines 504 that a power supply alert has not been received, the method 500 returns and continues to determine 504 if a power supply alert has been received. If the method 500 determines 504 that a power supply alert has been received, the method 500 transmits 506 a power reduction command to reduce power consumption of the computing equipment to a minimum power consumption and identifies 508 a number of PSUs 108 that have failed. The method 500 recalculates 510 the power cap limit based on a current number of functional PSUs 108 of the P power supply enclosures 106 and removes 512 the power reduction command. Power consumption of the computing equipment is limited to the power cap limit.

The method 500 determines 514 if a PSU replacement signal has been received. The PSU replacement signal indicates that a user is about to replace a power supply enclosure. If the method 500 determines 514 that a PSU replacement signal has not been received, the method 500 returns and continues to determine 514 if a PSU replacement signal has been received. If the method 500 determines 514 that a PSU replacement signal has been received, the method 500 sends 516 a power reduction command and calculates 518 a power cap limit that is equal to or less than a capacity of the P power supply enclosures 106 that are not being removed. The power cap limit is equal to or less than a capacity of the P power supply enclosures 106 that are not being removed. The method 500 removes 520 (follow "A" on FIG. 5A to "A" on FIG. 5B) the power reduction command so that power consumption of the computing equipment is limited to the power cap limit.

The method 500 determines 522 if a replacement power supply enclosure 106 is detected. If the method 500 determines 522 that a replacement power supply enclosure 106 is not detected, the method 500 returns and continues to determine 522 if a replacement power supply enclosure 106 is detected. If the method 500 determines 522 that a replacement power supply enclosure 106 is detected, the method 500 calculates 524 the power cap limit based on the PSUs 108 of the P power supply enclosures 106 including the replacement power supply enclosure 106, and the method 500 ends. The power cap limit is in compliance with the PSU redundancy policy and power consumption of the computing equipment is limited to the recalculated power cap limit. In various embodiments, all or a portion of the method 500 is implemented with the replacement signal detector 202, the power cap calculator 204, the enclosure detector 206, the power supply error detector 302, the power reduction command generator 304, and/or the PSU availability analyzer 306.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:

receiving a power supply unit ("PSU") replacement signal for a power supply chassis, wherein the replacement signal is received in response to an action by a user, the power supply chassis comprising a plurality of power supply enclosures, each power supply enclosure comprising a plurality of power supply units ("PSUs"), wherein each of the PSUs in the plurality of power supply enclosures is connected to a power bus providing power to computing equipment connected to the power bus, the power supply chassis comprising a PSU redundancy policy with at least one PSU of the PSUs of the plurality of power supply enclosures being redundant, wherein the PSU replacement signal indicates that a user is about to replace a power supply enclosure;

in response to the PSU replacement signal, calculating a power cap limit that is equal to or less than a capacity of the plurality of supply enclosures that are not being removed, wherein power consumption of the computing equipment is limited to the power cap limit; and in response to detecting a replacement power supply enclosure, recalculating the power cap limit based on the PSUs of the plurality of supply enclosures including the replacement power supply enclosure, the power cap limit in compliance with the PSU redundancy policy, wherein power consumption of the computing equipment is limited to the recalculated power cap limit.

2. The method of claim 1, further comprising, prior to receiving the PSU replacement signal:

calculating a power cap limit that is in compliance with the PSU redundancy policy and is based on the PSUs of the plurality of supply enclosures being functional;

receiving a power supply alert indicative of a failure of one or more the PSUs of the plurality of supply enclosures;

in response to receiving the power supply alert, transmitting a power reduction command to reduce power consumption of the computing equipment to a minimum power consumption;

identifying a number of PSUs that have failed;

recalculating the power cap limit based on a current number of functional PSUs of the plurality of supply enclosures; and removing the power reduction command, wherein power consumption of the computing equipment is limited to the power cap limit in response to the power reduction command being removed.

3. The method of claim 2, wherein when the number of PSUs that have failed is less than the number of PSUs in the power supply enclosure with failed PSUs, before receiving the PSU replacement signal the power cap limit is set to a value higher than the power cap limit calculated based on a power capacity of the plurality of supply enclosures that are not being removed.

4. The method of claim 2, wherein the power supply alert is generated by a PSU and wherein in response to the power supply alert, a controller identifies the number of PSUs that have failed.

5. The method of claim 2, wherein:

the power cap limit with functional PSUs in the plurality of supply enclosures is based on one or more of the PSUs being redundant according to the PSU redundancy policy;

the power cap limit with a power supply enclosure removed for replacement is up to a maximum total capacity of P−1 power supply enclosures where P is the number of power supply enclosures; and the power cap limit with one or more failed PSUs and before receiving the PSU replacement signal is up to a maximum total capacity of the functional PSUs in the plurality of supply enclosures.

6. The method of claim 1, further comprising:

in response to the PSU replacement signal, transmitting a power reduction command to reduce power consumption of the computing equipment to a minimum power consumption, wherein the power reduction command overrides the power cap limit; and removing the power reduction command in response to calculating the power cap limit that is equal to or less than a capacity of the plurality of supply enclosures that are not being removed, wherein power consumption of the computing equipment is limited to the power cap limit in response to the power reduction command being removed.

7. The method of claim 6, wherein the computing equipment comprises compute nodes and the power reduction command is a fast throttle command that reduces a clock speeds of processors, accelerators and/or graphics processing units ("GPUs") of the compute nodes to a minimum value.

8. The method of claim 1, wherein the computing equipment comprises compute nodes and a controller regulates power consumption of the compute nodes to below the power cap limit by regulating clock speeds of processors, accelerators, and/or graphic processing units ("GPUs") of the compute nodes.

9. The method of claim 1, wherein the PSU replacement signal is generated by a button on the power supply chassis and/or an interface to a management application.

10. The method of claim 1, wherein the computing equipment resides in the power supply chassis.

11. The method of claim 1, wherein the plurality of PSUs of the plurality of supply enclosures comprises M PSUs and the PSU redundancy policy is N+R, wherein M=N +R and R is one or more PSUs that are classified as redundant.

12. The method of claim 1, wherein each of the plurality of supply enclosures is water cooled.

13. An apparatus comprising:

a replacement signal detector module configured to receive a power supply unit ("PSU") replacement signal for a power supply chassis, wherein the replacement signal is received in response to an action by a user, the power supply chassis comprising plurality of supply enclosures, each power supply enclosure comprising a plurality of power supply units ("PSUs"), wherein each of the PSUs in the plurality of supply enclosures is connected to a power bus providing power to computing equipment connected to the power bus, the power supply chassis comprising a PSU redundancy policy with at least one PSU of the PSUs of the plurality of supply enclosures being redundant, wherein the PSU replacement signal indicates that a user is about to replace a power supply enclosure;

a power cap calculator module configured to, in response to the PSU replacement signal, calculate a power cap limit that is equal to or less than a capacity of the plurality of supply enclosures that are not being removed, wherein power consumption of the computing equipment is limited to the power cap limit; and an enclosure detector module configured to, in response to detecting a replacement power supply enclosure, recalculate the power cap limit based on the PSUs of the plurality of supply enclosures including the replacement power supply enclosure, the power cap limit in compliance with the PSU redundancy policy, wherein power consumption of the computing equipment is limited to the recalculated power cap limit, wherein said modules comprise hardware circuits, a programmable hardware device and/or code, the code stored on a non-transitory computer readable storage media.

14. The apparatus of claim 13, wherein prior to receiving the PSU replacement signal, further comprising:

the power cap calculator is further configured to calculate a power cap limit that is in compliance with the PSU redundancy policy and is based on the PSUs of the plurality of supply enclosures being functional;

a power supply error detector configured to receive a power supply alert indicative of a failure of one or more the PSUs of the plurality of supply enclosures;

a power reduction command generator configure to, in response to receiving the power supply alert, transmit a power reduction command to reduce power consumption of the computing equipment to a minimum power consumption;

a PSU availability analyzer configured to identify a number of PSUs that have failed;

the power cap calculator is further configured to recalculate the power cap limit based on a current number of functional PSUs of the plurality of supply enclosures; and the power reduction command generator is further configured to remove the power reduction command, wherein power consumption of the computing equipment is limited to the power cap limit in response to the power reduction command being removed.

15. The apparatus of claim 13, further comprising:

a power reduction command generator configured to, in response to the PSU replacement signal, transmit a power reduction command to reduce power consumption of the computing equipment to a minimum power consumption, wherein the power reduction command overrides the power cap limit; and the power reduction command generator is further configured to remove the power reduction command in response to calculating the power cap limit that is equal to or less than a capacity of the plurality of supply enclosures that are not being removed, wherein power consumption of the computing equipment is limited to the power cap limit in response to the power reduction command being removed.

16. The apparatus of claim 15, wherein the computing equipment comprises compute nodes and:

the power reduction command is a fast throttle command that reduces a clock speeds of processors, accelerators, and/or graphic processing units ("GPUs") of the compute nodes to a minimum value;

a controller regulates power consumption of the compute nodes to below the power cap limit by regulating clock speeds of processors and/or GPUs of the compute nodes; and/or the PSU replacement signal is generated by a button on the power supply chassis and/or an interface to a management application.

17. The apparatus of claim 13, wherein:

the power cap limit with the PSUs of the plurality of supply enclosures functional is based on one or more of the PSUs being redundant according to the PSU redundancy policy;

the power cap limit with a power supply enclosure removed for replacement is up to a maximum total capacity of P−1 power supply enclosures where P is the number of power supply enclosures; and the power cap limit with one or more failed PSUs and before receiving the PSU replacement signal is up to a maximum total capacity of the functional PSUs in the plurality of supply enclosures.

18. A program product comprising non-transitory non-volatile storage comprising program code, the program code being configured to be executable by a processor to perform operations comprising:

receiving a power supply unit ("PSU") replacement signal for a power supply chassis, wherein the replacement signal is received in response to an action by a user, the power supply chassis comprising plurality of supply enclosures, each power supply enclosure comprising a plurality of power supply units ("PSUs"), wherein each of the PSUs in the plurality of supply enclosures is connected to a power bus providing power to computing equipment connected to the power bus, the power supply chassis comprising a PSU redundancy policy with at least one PSU of the PSUs of the plurality of supply enclosures being redundant, wherein the PSU replacement signal indicates that a user is about to replace a power supply enclosure;

in response to the PSU replacement signal, calculating a power cap limit that is equal to or less than a capacity of the plurality of supply enclosures that are not being removed, wherein power consumption of the computing equipment is limited to the power cap limit; and in response to detecting a replacement power supply enclosure, recalculating the power cap limit based on the PSUs of the plurality of supply enclosures including the replacement power supply enclosure, the power cap limit in compliance with the PSU redundancy policy, wherein power consumption of the computing equipment is limited to the recalculated power cap limit.

19. The program product of claim 18, wherein the program code is further configured to perform operations comprising, prior to receiving the PSU replacement signal:

calculating a power cap limit that is in compliance with the PSU redundancy policy and is based on the PSUs of the plurality of supply enclosures being functional;

receiving a power supply alert indicative of a failure of one or more the PSUs of the plurality of supply enclosures;

transmitting a power reduction command to reduce power consumption of the computing equipment to a minimum power consumption;

identifying a number of PSUs that have failed;

recalculating the power cap limit based on a current number of functional PSUs of the plurality of supply enclosures; and removing the power reduction command, wherein power consumption of the computing equipment is limited to the power cap limit in response to the power reduction command being removed.

20. The program product of claim 18, wherein the program code is further configured to perform operations comprising:

in response to the PSU replacement signal, transmitting a power reduction command to reduce power consumption of the computing equipment to a minimum power consumption, wherein the power reduction command overrides the power cap limit; and removing the power reduction command in response to calculating the power cap limit that is equal to or less than a capacity of the plurality of supply enclosures that are not being removed, wherein power consumption of the computing equipment is limited to the power cap limit in response to the power reduction command being removed.

* * * * *